(12) United States Patent
Nonoyama

(10) Patent No.: US 7,714,417 B2
(45) Date of Patent: May 11, 2010

(54) SUBSTRATE FOR MOUNTING SEMICONDUCTOR ELEMENT AND METHOD OF MANUFACTURING THE SAME

(75) Inventor: Shigeru Nonoyama, Kadoma (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/042,360

(22) Filed: Mar. 5, 2008

(65) Prior Publication Data
US 2008/0217751 A1 Sep. 11, 2008

(30) Foreign Application Priority Data
Mar. 8, 2007 (JP) .............................. 2007-057931

(51) Int. Cl.
*H01L 23/02* (2006.01)
(52) U.S. Cl. ................... 257/669; 257/E23.181
(58) Field of Classification Search .................. 438/308, 438/734; 257/734, 774–779, 678, 669, 666, 257/E23.181
See application file for complete search history.

(56) References Cited

U.S. PATENT DOCUMENTS

| 6,107,679 | A * | 8/2000 | Noguchi | 257/678 |
| 6,831,372 | B2 * | 12/2004 | Ruhland | 257/783 |
| 6,841,884 | B2 * | 1/2005 | Shizuno | 257/777 |
| 2006/0157865 | A1 * | 7/2006 | Hokari | 257/774 |

FOREIGN PATENT DOCUMENTS

JP          8-153823          6/1996

* cited by examiner

*Primary Examiner*—Nathan W Ha
(74) *Attorney, Agent, or Firm*—Steptoe & Johnson LLP

(57) ABSTRACT

The present invention provides a semiconductor element mounting substrate 101 including: a base substrate 1 having a region 2 for mounting a semiconductor element 11, the region 2 being set on the major surface of the base substrate 1; a plurality of wiring patterns 3 formed on the base substrate 1 and connected to the semiconductor element 11; and a dummy pattern 8 formed like a frame in the region 2 for mounting the semiconductor element 11 and not connected to the wiring patterns 3.

8 Claims, 5 Drawing Sheets

SUBSTRATE FOR MOUNTING SEMICONDUCTOR ELEMENT AND METHOD OF MANUFACTURING THE SAME

FIELD OF THE INVENTION

The present invention relates to a substrate for mounting a semiconductor element used for a resin molding semiconductor device and so on, and a method of manufacturing the same.

BACKGROUND OF THE INVENTION

Some conventional substrates for mounting semiconductor elements include semiconductor element mounting regions set on the major surfaces (hereinafter, will be referred to as front sides) and a plurality of wiring patterns on the front and back sides.

Generally, substrates for mounting semiconductor elements have been reduced in thickness in response to demand for thin semiconductor devices. Thus the influence of a difference in wiring density between both sides of the substrate considerably increases and causes greater warpage, so that it is difficult to stably apply an adhesive over a semiconductor element mounting region. Further, an unevenly applied adhesive reduces the bonding strength of a semiconductor element and thus reduces the reliability of a semiconductor device.

In order to evenly apply an adhesive, a technique has been proposed in which warpage is suppressed by radially forming wiring patterns from the center of a semiconductor element mounting portion to the outer periphery of a substrate. In the semiconductor element mounting portion, warpage is suppressed by regulating the formation of the wiring patterns on the front side of the substrate and equalizing the wiring densities of the front and back sides of the substrate (Japanese Patent Laid-Open No. 8-153823).

In recent years, there has been an increasing demand for thin semiconductor devices and accordingly, semiconductor elements and substrates for mounting semiconductor elements have been reduced in thickness and adhesives have been reduced in viscosity to improve the stability of assembly. Moreover, in response to demand for semiconductor devices including a larger number of pins with smaller sizes, it has been necessary to form wiring also immediately under semiconductor elements, on substrates for mounting the semiconductor elements.

As substrates for mounting semiconductor elements are reduced in thickness, an amount of deformation such as warpage increases. In the above-mentioned method of radially forming wiring, when a semiconductor element is pressed onto an applied adhesive, the adhesive is likely to leak out of the semiconductor element through a gap between the semiconductor element and a wire and a gap between wires. Further, air is likely to be entrained immediately under the semiconductor element from a surrounding part through the gaps.

When the adhesive leaks out of the semiconductor element, the adhesive becomes thin and uneven immediately under the semiconductor element, causing an insufficient bonding strength. When air is entrained directly under the semiconductor element, the air expands due to a thermal stress applied when the semiconductor device is mounted on a mounting board, so that the semiconductor device may be broken or the reliability may be reduced.

DISCLOSURE OF THE INVENTION

In consideration of the problem, an object of the present invention is to provide a substrate for mounting a semiconductor element which can suppress the leakage of a paste adhesive immediately under the semiconductor element and the entrainment of air immediately under the semiconductor element when the semiconductor element is fixed with the adhesive.

In order to attain the object, a substrate for mounting a semiconductor element of the present invention includes: a base substrate having a region for mounting the semiconductor element, the region being set on the major surface of the base substrate; a plurality of wiring patterns formed on the base substrate and connected to the semiconductor element; and a dummy pattern formed like a frame in the region for mounting the semiconductor element, the dummy pattern not being connected to the wiring patterns.

With this configuration, when the semiconductor element is fixed with a paste adhesive in the region for mounting the semiconductor element, the frame-like dummy pattern makes it possible to prevent the adhesive immediately under the semiconductor element from leaking out of the semiconductor element, obtain a desired amount of the adhesive, and prevent the entrainment of air immediately under the semiconductor element.

The dummy pattern may be made of the same conductor material as the wiring patterns and insulated from the wiring patterns. Further, the dummy pattern may be made of an insulating material.

The dummy pattern preferably has a larger thickness than the wiring pattern. A plurality of dummy patterns are preferably formed inward and outward from each other. The inner dummy pattern preferably has a larger thickness than the outer dummy pattern.

A method of manufacturing a substrate for mounting a semiconductor element according to the present invention includes the steps of: forming a plurality of wiring patterns to be connected to the semiconductor element, on desired points on a base substrate having a region for mounting the semiconductor element, the region being set on the major surface of the base substrate; forming an insulating resin film for covering the wiring patterns; and forming a frame-like dummy pattern in the region for mounting the semiconductor element without connecting the dummy pattern to the wiring patterns.

The step of forming the dummy pattern can be performed using the same conductor material in the step of forming the wiring patterns. The step of forming the dummy pattern can be performed using the same resin material in the step of forming the insulating resin film for covering the wiring patterns.

The step of forming the wiring patterns may include a first step of forming the wiring patterns such that a plurality of electrode terminals connected to the semiconductor element and electrode terminals for external connection are disposed on predetermined positions on the major surface and the other surface of the base substrate; and a second step of forming vias on predetermined positions for electrically connecting the plurality of electrode terminals and the corresponding electrode terminals for external connection.

DESCRIPTION OF THE EMBODIMENTS

Exemplary embodiments of the present invention will now be described in accordance with the accompanying drawings.

Figure 1A:
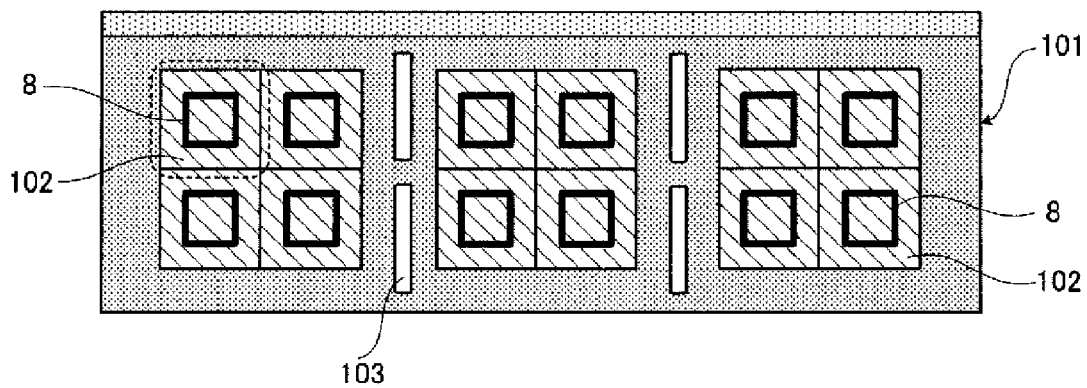
FIGS. 1(A) to 1(D) show the configuration of a substrate for mounting a semiconductor element and the configuration of a semiconductor device using the substrate according to a first embodiment of the present invention.
Figure 1B:
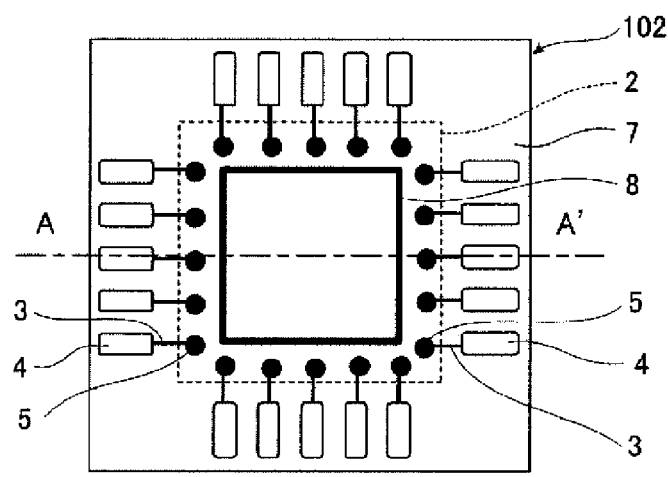
Figure 1C:
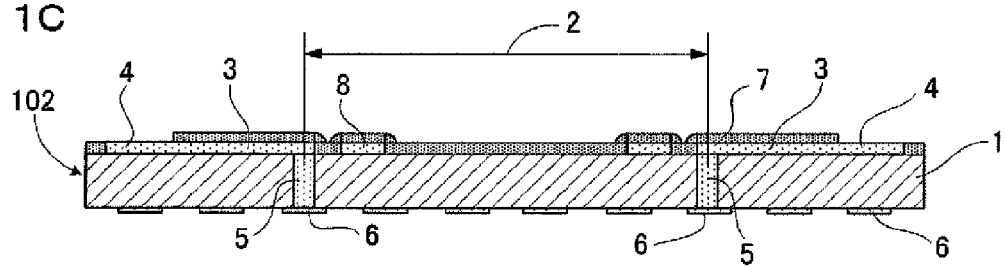
Figure 1D:
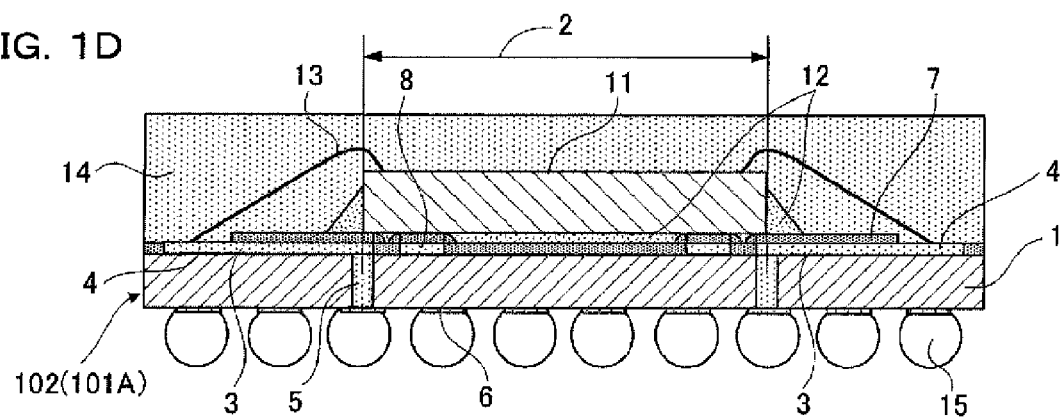

FIG. 1(A) is a plan view showing a substrate for mounting semiconductor elements according to a first embodiment of the present invention. FIGS. 1(B) and 1(C) are a plan view and a sectional view showing an enlarged part of the substrate for mounting the semiconductor element. FIG. 1(D) is a sectional view showing a semiconductor device using the substrate for mounting the semiconductor element.

In FIG. 1(A), a semiconductor element mounting substrate 101 is used for collectively manufacturing a plurality of semiconductor devices and is formed using glass epoxy resin and the like as a base material (base substrate). On the semiconductor element mounting substrate 101, a plurality of device regions 102 are arranged in rows and columns and multiple sets of the device regions 102 are arranged with slits 103 interposed between the sets of regions.

In the device region 102, as shown in FIGS. 1(B) and 1(C), a square semiconductor element mounting region 2 (having the same shape and size as the semiconductor element) on which the semiconductor element is mounted is set on the major surface (hereinafter, will be referred to as the front side) of a base substrate 1. A plurality of wiring patterns 3 are formed on the front and back sides of the base substrate and vias 5 are formed for connecting, on predetermined positions, the wiring patterns 3 on the front and back sides.

The plurality of wiring patterns 3 on the front side are so arranged as to surround the semiconductor element mounting region 2 and extend from the inside of the boundary of the semiconductor element mounting region 2 to the outside so as to be orthogonal to the boundary. On the outer ends of the wiring patterns 3, electrode portions 4 are formed for electrical connection with the semiconductor element. On the plurality of wiring patterns 3 on the back side, external connecting terminals 6 are formed and arranged in a grid-like fashion. On the front side of the base substrate, an insulating resin film 7 is formed on a part other than the electrode portions 4. For the wiring patterns 3, the electrode portions 4, the vias 5, and the external connecting terminals 6, metals such as copper (Cu) are used. For the insulating resin film 7, materials such as solder resist are used.

In the semiconductor element mounting region 2, a dummy pattern 8 not electrically connected to the wiring patterns 3 is formed like a frame so as to be opposed to the underside of the semiconductor element. In other words, the dummy pattern 8 is formed inside the boundary (that is, the outer end of the mounted semiconductor element) of the semiconductor element mounting region 2 and in parallel with the boundary. The dummy pattern 8 will be described later again.

In the semiconductor device shown in FIG. 1(D), a semiconductor element 11 is fixed on the semiconductor element mounting region 2 of a semiconductor element mounting substrate 101A (corresponding to the device region 102 of the semiconductor element mounting substrate 101) with an adhesive 12 of an epoxy resin and so on. The plurality of electrodes of the semiconductor element 11 and the corresponding electrode portions 4 are electrically connected to each other via bonding wires 13 made of gold (Au) and so on. In order to protect the semiconductor element 11 and the bonding wires 13 from the external environment, the front side of the base substrate is covered with molding resin 14 composed of an epoxy resin and so on. On the external connecting terminals 6 on the back side of the base substrate, ball electrodes 15 are formed by soldering and the like to make connection with an external mounting board and so on. Such a semiconductor device is called a BGA (Ball Grid Array) package.

When this semiconductor device is manufactured, the semiconductor element 11 is fixed in each of the device regions 102 of the semiconductor element mounting substrate 101 shown in FIG. 1(A), the semiconductor element 11 is electrically connected to the device region 102, a region larger than each set of the device regions 102 (four regions in FIG. 1(A)) is entirely molded with the molding resin 14, and then the region is divided into the device regions 102 by dicing. The ball electrodes 15 are mounted before or after dicing.

Referring to FIG. 2, a method of manufacturing the semiconductor element mounting substrate 101 will be described below. For the sake of simplicity, only one of the device regions 102 is illustrated.

Figure 2A:
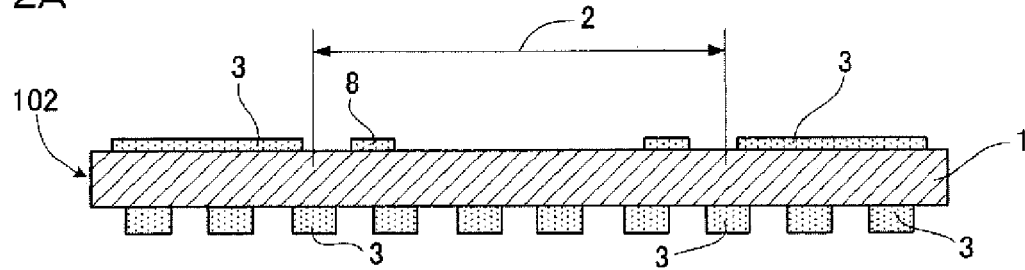
FIGS. 2(A) to 2(E) are sectional views showing the steps of manufacturing the substrate for mounting the semiconductor element shown in FIGS. 1(A) to 1(D) and mounting the semiconductor element.

First, as shown in FIG. 2(A), the plurality of wiring patterns 3 are formed on the front and back sides of the base substrate 1 and the frame-like dummy pattern 8 is formed in the semiconductor element mounting region 2. In order to form the wiring patterns 3 and the dummy pattern 8, a resin coating (not shown) made of a photoresist and the like is formed into a desired shape on the base substrate 1 on which metal foil made of copper and the like is formed, and the metal foil is etched (dry or wet) with the resin coating acting as a mask.

Figure 2B:
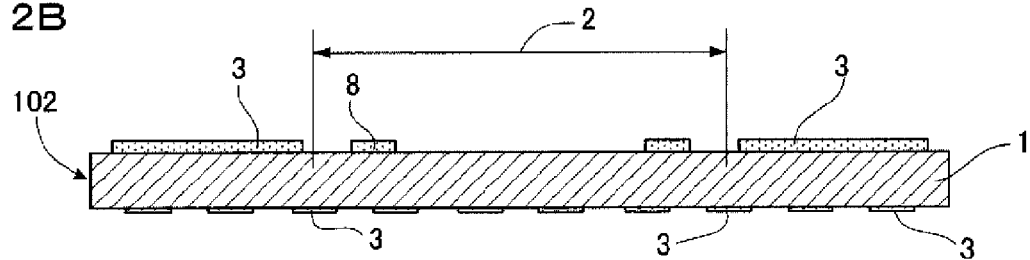

Next, as shown in FIG. 2(B), the wiring patterns 3 and the dummy pattern 8 are etched to a desired thickness. In this case, the wiring patterns 3 and the dummy pattern 8 have the same thickness. When the wiring patterns 3 and the dummy pattern 8 have different thicknesses, the metal foil is etched after the mask (not shown) is formed.

Figure 2C:
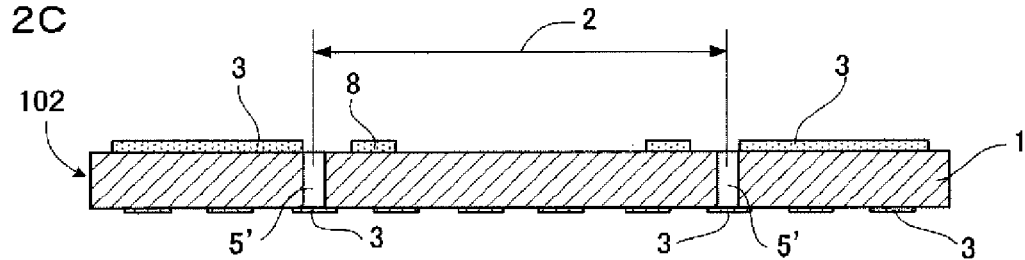
Figure 2D:
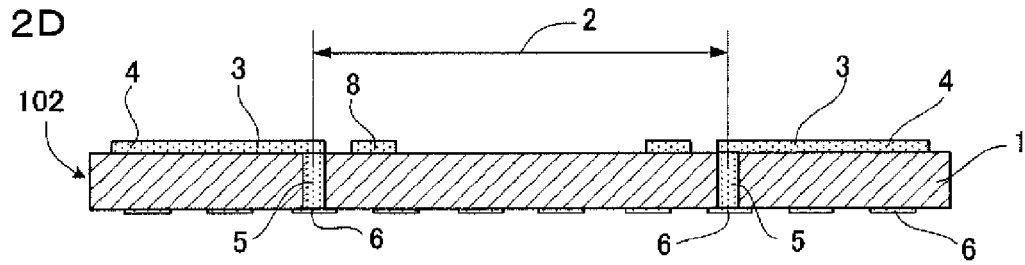

As shown in FIGS. 2(C) and 2(D), through holes 5; are formed on predetermined positions by drilling, laser beam machining, and so on and are plated with a metal such as copper (Cu), so that the vias 5 are formed for connecting the wiring patterns 3 on the front and back sides and plating is formed on the wiring patterns 3 at the same time.

Figure 2E:
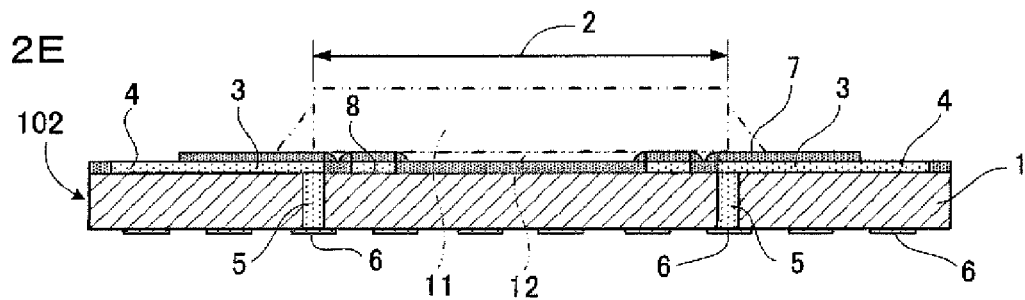

As shown in FIG. 2(E), a part other than the electrode portions 4 is covered with the insulating resin film 7 in order to protect the wiring patterns 3 from the external environment. The dummy pattern 8 is also covered with the insulating resin film 7.

Virtual lines indicate a state in which when the semiconductor device of FIG. 1(D) is manufactured, the paste adhesive 12 is applied onto the semiconductor element mounting region 2 and the semiconductor element 11 is mounted thereon. The frame-like dummy pattern 8 is disposed immediately under the inner side of the outer end of the semiconductor element 11 and in parallel with the four sides of the semiconductor element 11.

The dummy pattern 8 surrounds the adhesive 12 immediately under the semiconductor element 11 to prevent the adhesive 12 from leaking out of the semiconductor element 11, so that a uniform amount of the adhesive 12 can be obtained with a predetermined thickness up to at least the thickness of the dummy pattern 8 immediately under the semiconductor element 11. Further, it is possible to prevent the entrainment of air immediately under the semiconductor element 11. Another effect is to suppress the warpage of the semiconductor element mounting substrate 101 having been reduced in thickness and increased in wiring density.

To be specific, the semiconductor element mounting substrate 101 has the wiring patterns 3 also immediately under the semiconductor element 11 and the adhesive 12 having a low viscosity has been used in recent years. Thus the adhesive 12 is likely to be discharged. Further, since the semiconductor element mounting substrate 101 has been reduced in thickness in recent years, the overall substrate is likely to warp and air is likely to be entrained immediately under the semiconductor element 11. In other words, the semiconductor element mounting substrate 101 is placed on a flat plate when the semiconductor element 11 is mounted. Thus the semiconductor element mounting substrate 101 is temporarily flattened by a pressure during mounting. In this state, an even layer of the adhesive 12 is formed between the semiconductor element mounting substrate 101 and the semiconductor element 11, and the semiconductor element mounting substrate 101 is warped again upon release of the pressure. When the semiconductor element mounting substrate 101 is warped again, air is entrained immediately under the semiconductor element 11 through gaps between the wiring patterns 3, so that air-entrained voids are likely to be formed. The dummy pattern 8 can suppress the occurrence of such voids.

Thus in the assembly of the semiconductor device, the bonding strength of the semiconductor element 11 is improved and stable production can be achieved. Moreover, it is possible to prevent breaks caused by a thermal stress and the like during the mounting of the semiconductor device, thereby improving the reliability.

This feature is quite effective under present circumstances in which semiconductor devices have been reduced in size and thickness with a larger number of pins in recent years and accordingly, a smaller thickness has been demanded of semiconductor elements and substrates for mounting semiconductor elements and a higher wiring density is demanded of substrates for mounting semiconductor elements. In other words, the substrate for mounting the semiconductor element of the present invention is particularly useful for manufacturing thin and small semiconductor devices including a large number of pins.

Figure 3A:
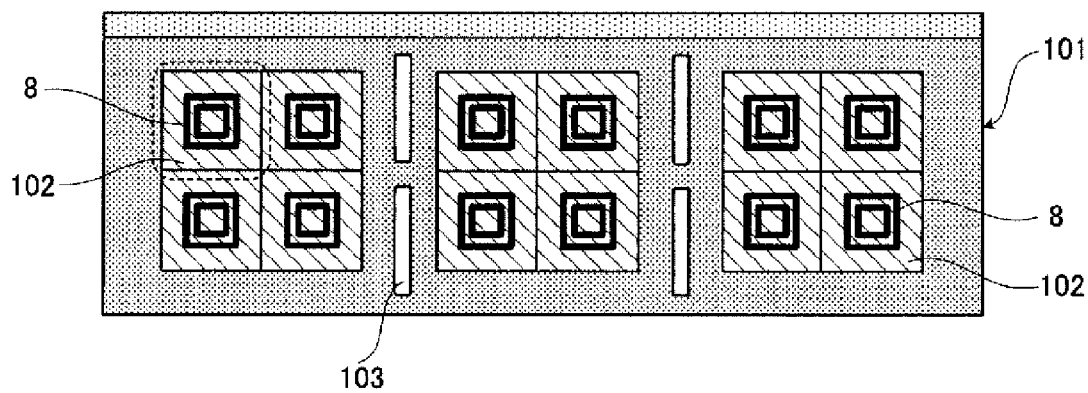
FIGS. 3(A) to 3(D) show the configuration of a substrate for mounting a semiconductor element and the configuration of a semiconductor device using the substrate according to a second embodiment of the present invention.
Figure 3B:
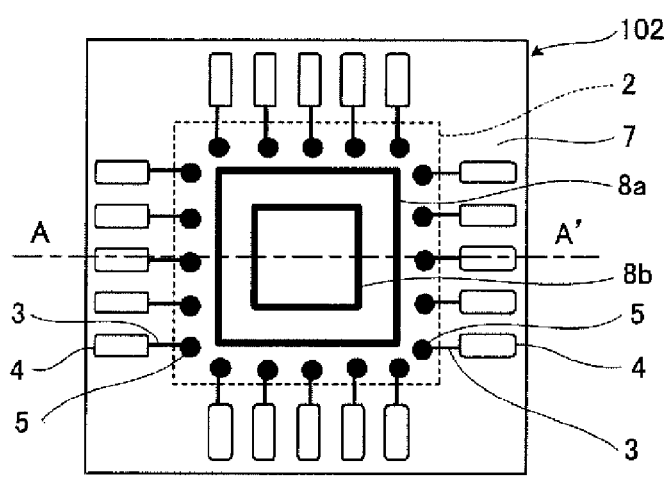
Figure 3C:
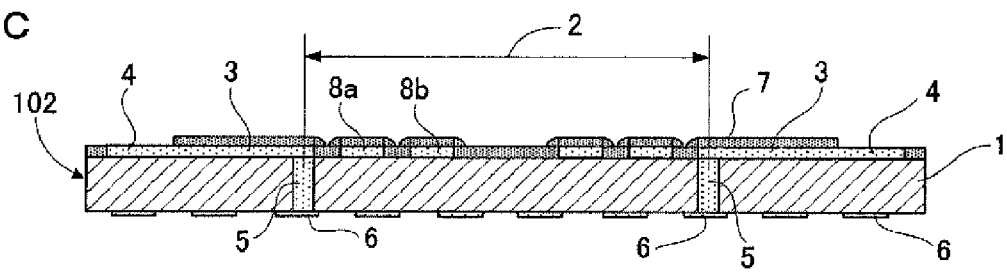
Figure 3D:
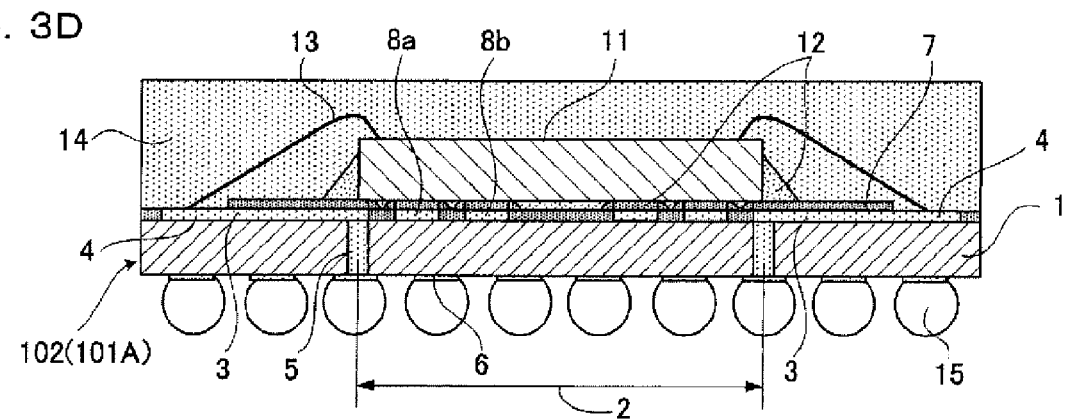

FIG. 3(A) is a plan view showing a substrate for mounting semiconductor elements according to a second embodiment of the present invention. FIGS. 3(B) and 3(C) are a plan view and a sectional view showing an enlarged part of the substrate for mounting the semiconductor element. FIG. 3(D) is a sectional view showing a semiconductor device using the substrate for mounting the semiconductor element.

On a semiconductor element mounting substrate 101 of the second embodiment, a frame-like dummy pattern 8a is formed with the same shape and thickness as the dummy pattern 8 of the first embodiment. Further, a dummy pattern 8b is concentrically formed inside the dummy pattern 8a with the same thickness. Thus an adhesive 12 immediately under a semiconductor element 11 is more unlikely to be discharged out of the semiconductor element 11.

Figure 4A:
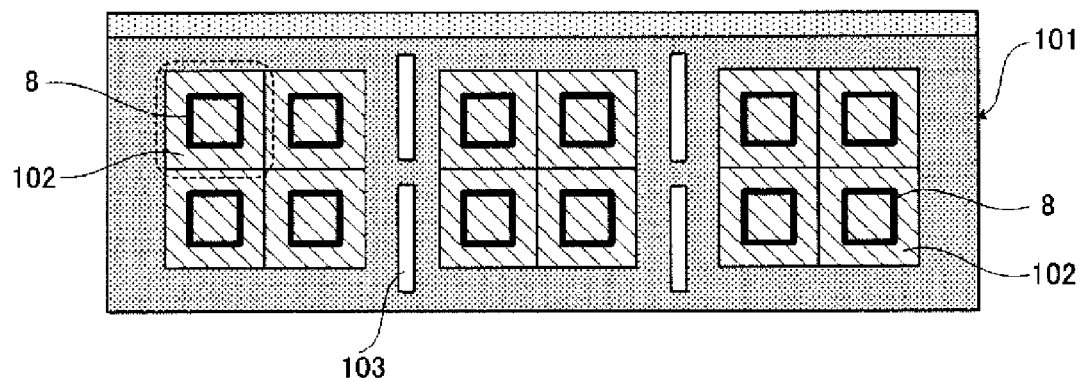
FIGS. 4(A) to 4(D) show the configuration of a substrate for mounting a semiconductor element and the configuration of a semiconductor device using the substrate according to a third embodiment of the present invention.
Figure 4B:
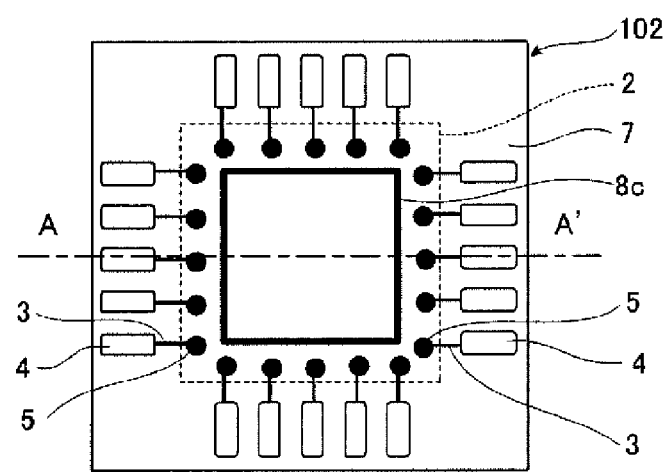
Figure 4C:
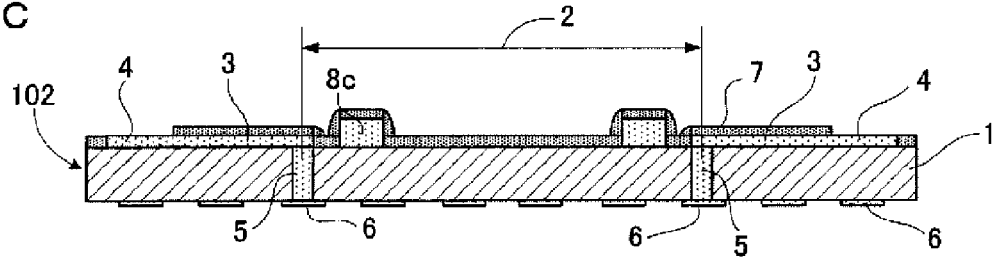
Figure 4D:
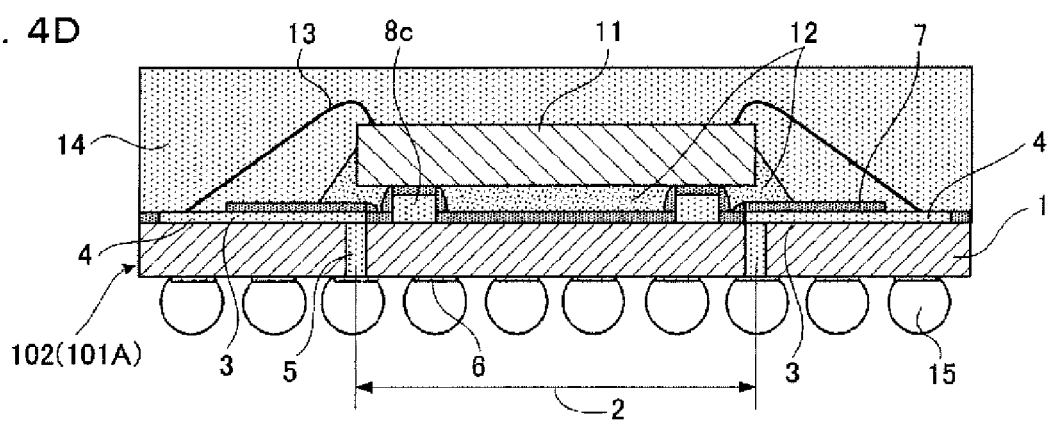

FIG. 4(A) is a plan view showing a substrate for mounting semiconductor elements according to a third embodiment of the present invention. FIGS. 4(B) and 4(C) are a plan view and a sectional view showing an enlarged part of the substrate for mounting the semiconductor element. FIG. 4(D) is a sectional view showing a semiconductor device using the substrate for mounting the semiconductor element.

On a semiconductor element mounting substrate 101 of the third embodiment, a frame-like dummy pattern 8c is formed with the same shape as the dummy pattern 8 of the first embodiment and has a larger thickness than the dummy pattern 8. Thus an adhesive 12 immediately under a semiconductor element 11 is more unlikely to be discharged out of the semiconductor element 11 and it is possible to more effectively prevent the entrainment of air immediately under the semiconductor element 11.

Figure 5A:
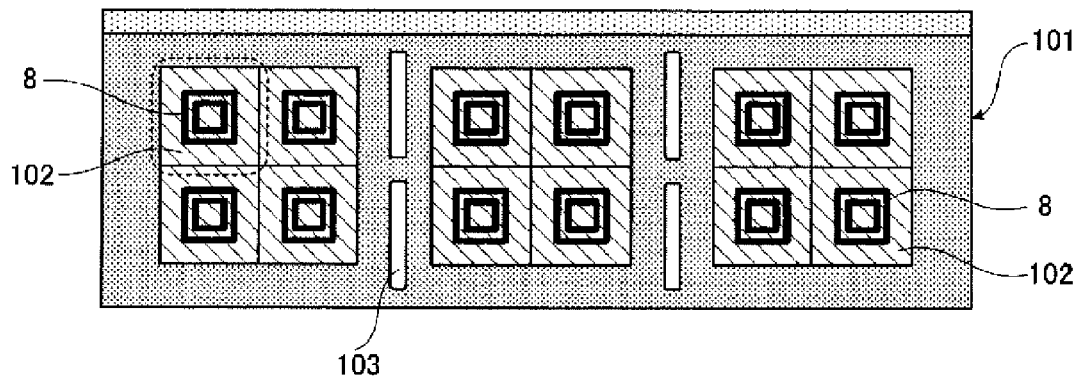
FIGS. 5(A) to 5(D) show the configuration of a substrate for mounting a semiconductor element and the configuration of a semiconductor device using the substrate according to a fourth embodiment of the present invention.
Figure 5B:
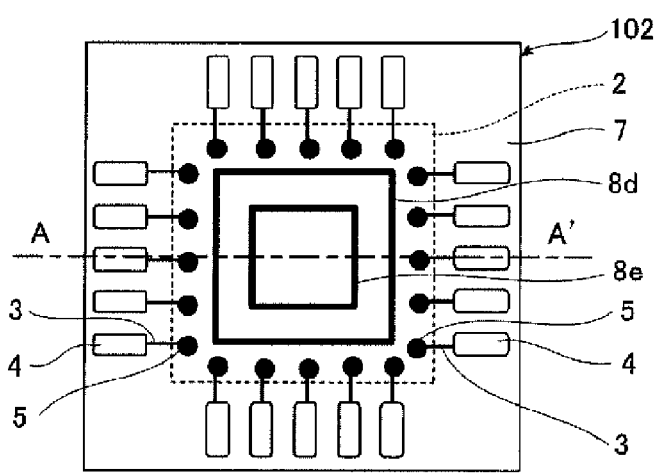
Figure 5C:
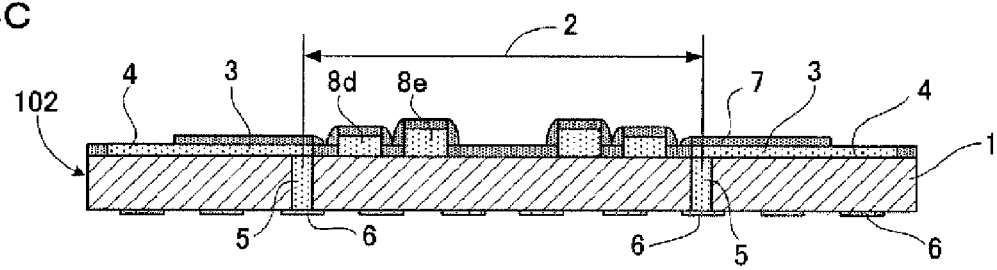
Figure 5D:
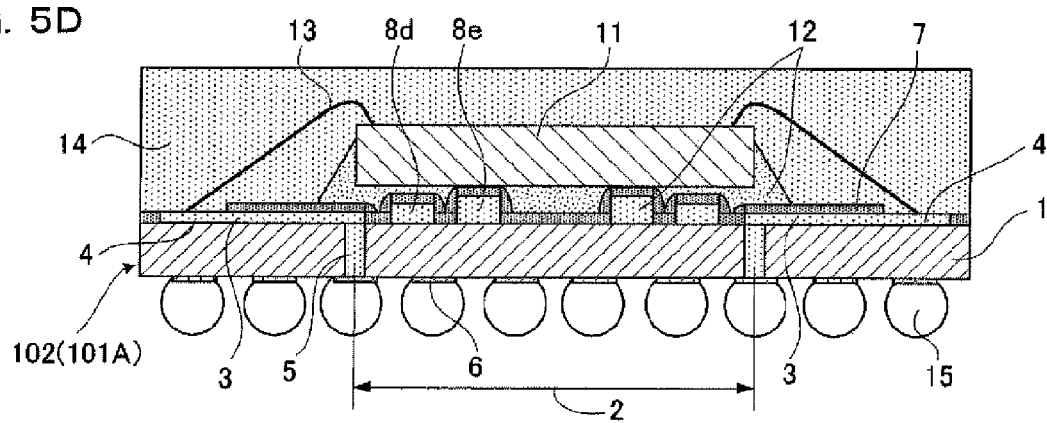

FIG. 5(A) is a plan view showing a substrate for mounting semiconductor elements according to a fourth embodiment of the present invention. FIGS. 5(B) and 5(C) are a plan view and a sectional view showing an enlarged part of the substrate for mounting the semiconductor element. FIG. 5(D) is a sectional view showing a semiconductor device using the substrate for mounting the semiconductor element.

On a semiconductor element mounting substrate 101 of the fourth embodiment, a frame-like dummy pattern 8d is formed with the same shape as the dummy pattern 8 of the first embodiment and has a larger thickness than the dummy pattern 8. Further, a dummy pattern 8e having a larger thickness is concentrically formed inside the dummy pattern 8d. Thus an adhesive 12 immediately under a semiconductor element 11 is more unlikely to be discharged out of the semiconductor element 11 and it is possible to more effectively prevent the entrainment of air immediately under the semiconductor element 11.

In the above explanation, the dummy patterns 8 and 8a to 8e are formed using the same material in the process of forming the wiring patterns 3. The dummy patterns may be formed using the same resin material in the process of forming the insulating resin film 7.

Further, in the above explanation, the semiconductor element 11 is connected to the wiring patterns 3 via the bonding wires 13. The wiring patterns 3 and the electrode portions 4 may be formed in a manner that enables the semiconductor element 11 to be flip-chip mounted.

The substrate for mounting the semiconductor element of the present invention includes both of the semiconductor element mounting substrate 101 used for collectively manufacturing a plurality of semiconductor devices and the semiconductor element mounting substrate 101A corresponding to one of the semiconductor devices.

What is claimed is:

1. A substrate for mounting a semiconductor element, comprising:
a base substrate having a region for mounting the semiconductor element, the region being set on a major surface of the base substrate;
a plurality of wiring patterns formed on the base substrate and connected to the semiconductor element; and
a dummy pattern formed like a frame in the region for mounting the semiconductor element and not connected to the wiring patterns;
the semiconductor element connected to the dummy pattern without an adhesive; and
the semiconductor element fixed on the base substrate with an adhesive.

2. The substrate for mounting a semiconductor element according to claim 1, wherein the dummy pattern is made of the same conductor material as the wiring patterns and is insulated from the wiring patterns.

3. The substrate for mounting a semiconductor element according to claim 1, wherein the dummy pattern is made of an insulating material.

4. The substrate for mounting a semiconductor element according to claim 1, wherein the dummy pattern has a larger thickness than the wiring pattern.

5. The substrate for mounting a semiconductor element according to claim 1, wherein a plurality of dummy patterns are formed inward and outward from each other.

6. The substrate for mounting a semiconductor element according to claim 5, wherein the inner dummy pattern has a larger thickness than the outer dummy pattern.

7. A substrate for mounting a semiconductor element, comprising:
- a base substrate having a region for mounting a semiconductor element, the region being set on a major surface of the base substrate;
- a plurality of wiring patterns formed on the base substrate for connection to a semiconductor element;
- a frame-like dummy pattern formed in the region for mounting a semiconductor element and not connected to the wiring patterns;
- a semiconductor element connected to the dummy pattern and to the wiring patterns; and
- an adhesive in the volume surrounded by the semiconductor element, the dummy pattern and the base substrate.

8. A substrate for mounting a semiconductor element, comprising:
- a base substrate having a region for mounting a semiconductor element, the region being on a major surface of the base substrate;
- a plurality of wiring patterns formed on the base substrate for connection to a semiconductor element;
- a frame-like dummy pattern in the region for mounting a semiconductor element and not connected to the wiring patterns;
- a semiconductor element connected to the dummy pattern and to the wiring patterns;
- the semiconductor element fixed on the base substrate with an adhesive; and
- a thickness of the adhesive is less than a thickness of the dummy pattern.

* * * * *